Aug. 7, 1962 F. A. ROCCHI ET AL 3,048,268
PACKAGE FOR ELECTRICAL COMPONENTS
Original Filed May 20, 1957 3 Sheets-Sheet 1
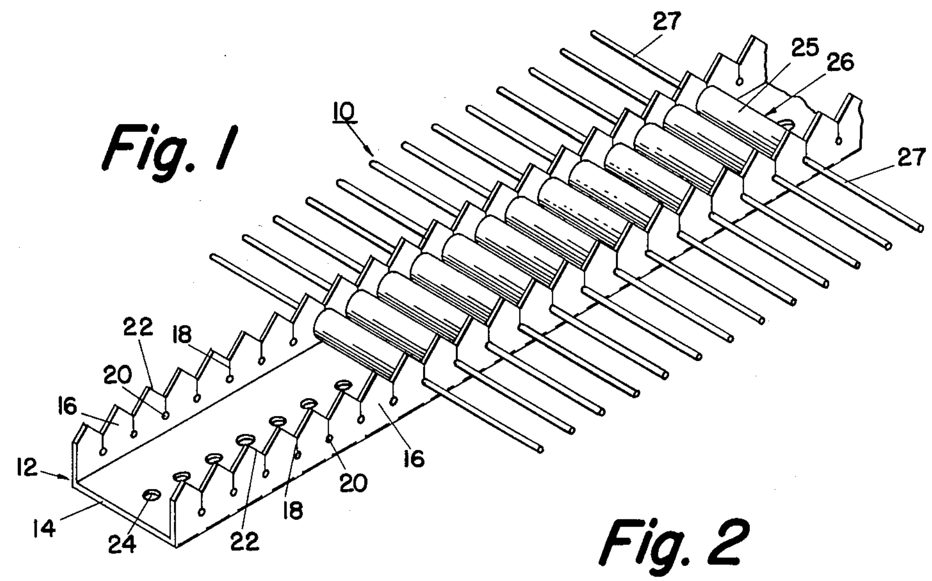
Fig. 1 Fig. 2
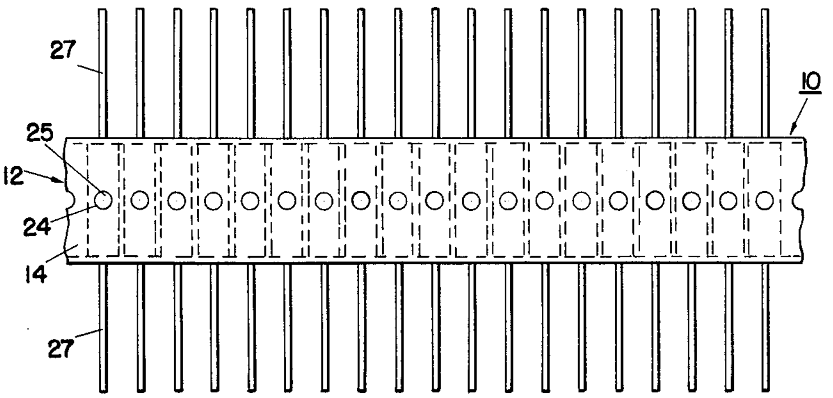
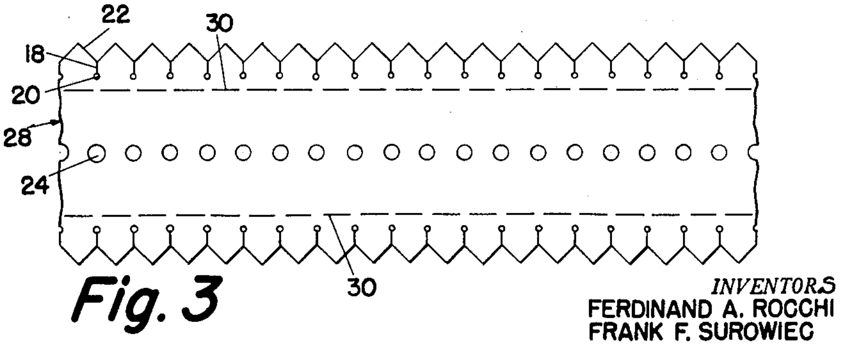
Fig. 3
INVENTORS
FERDINAND A. ROCCHI
FRANK F. SUROWIEC Aug. 7, 1962 F. A. ROCCHI ET AL 3,048,268

PACKAGE FOR ELECTRICAL COMPONENTS

Original Filed May 20, 1957 3 Sheets-Sheet 2

INVENTORS
FERDINAND A. ROCCHI
FRANK F. SUROWIEC

PACKAGE FOR ELECTRICAL COMPONENTS

Original Filed May 20, 1957 3 Sheets-Sheet 3

INVENTORS
FERDINAND A. ROCCHI
FRANK F. SUROWIEC 3,048,268

PACKAGE FOR ELECTRICAL COMPONENTS

Ferdinand A. Rocchi, Wappingers Falls, N.Y., and Frank F. Surowiec, Huntingdon Valley, Pa., assignors to International Resistance Company, Philadelphia, Pa.

Continuation of application Ser. No. 660,130, May 20, 1957. This application Feb. 12, 1962, Ser. No. 172,828
11 Claims. (Cl. 206—65)

This invention relates to a mounting and packaging of electrical components, such as resistors, capacitors and rectifiers, of the type comprising a body portion having a wire lead extending axially from opposite ends thereof. This is a continuation of our co-pending application Serial No. 660,130, filed May 20, 1957, entitled "Package for Electrical Components," now abandoned.

For the manufacturers of electrical components there are a number of factors involved in the manner in which the components must be mounted and packaged. One problem is with regard to the needs of the large industrial users of the components, such as the manufacturers of radio and television sets. The present trend in the mass production of such electronic equipment is toward "automation," i.e. the automatic assembly of the electrical components making up the equipment. For this purpose the components must be packaged in an oriented manner to permit ease of feeding the components into the automatic assembly apparatus. In addition, the packages must contain a large quantity of the components to permit continuous operation of the assembly apparatus. In contrast, there is the problem of the small users of electrical components, including the independent repairmen, who require packages containing small quantities of the components and that the packages are easy to store. All users, both large and small, require that the components are packaged in a manner that the packages can be easily handled without the components becoming loose but still allowing ease of removing the components from the packing when required. In addition, the particular components must be easily discernible in the package so that the user can locate the required component when needed. Heretofore to meet the particular needs for each type of user it has been necessary to package components in a different manner for each type of user. This has been expensive not only because of the additional cost for each type of package but also because of the additional expense for the different types of equipment needed to place the components in the various types of packages.

It is therefore an object of this invention to provide an inexpensive package for electrical components which is adapted to contain any desired quantity of the components. It is another object of this invention to provide a package for electrical components which mechanically holds the components tightly to permit ease of handling the package but from which the components can be easily and quickly removed. It is a further object of this invention to provide an inexpensive package for electrical components which is flexible and tightly holds the components. It is still a further object of this invention to provide an inexpensive package for electrical components which mounts the components for feeding into automatic assembly apparatus. It is still another object of this invention to provide a package for electrical components which can be easily stored with the particular components therein being easily discernible. Other objects of the invention will in part be obvious and will in part appear hereinafter.

The invention accordingly comprises the features of construction, combinations of elements, and arrangement of parts, which will be exemplified in the constructions hereinafter set forth, and the scope of the invention will be indicated in the claims.

For a fuller understanding of the nature and objects of the invention, reference should be had to the following detailed description taken in connection with the accompanying drawings in which:

FIGURE 1 is a perspective view of the package of this invention;

FIGURE 2 is a bottom plan view of the package shown in FIGURE 1;

FIGURE 3 is a plan view of the blank from which the package is formed;

Figures 4, 5, 6:
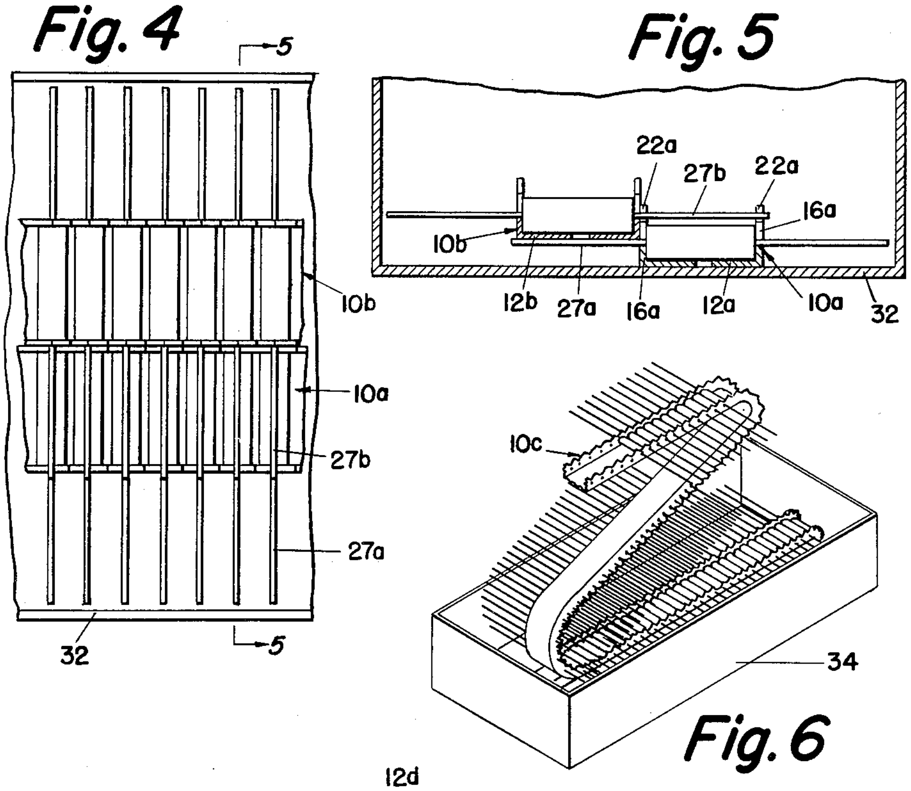
FIGURE 4 is a top plan view of one method of arranging the package shown in FIGURE 1 in a shipping container.
FIGURE 5 is a transverse cross-sectional view of the arrangement taken along line 5—5 of FIGURE 4.
FIGURE 6 is a perspective view of another arrangement of the package in a shipping container.

Referring to FIGURE 1 of the drawing, the package 10 of this invention comprises an elongated substantially U-shaped channel-like strip 12 of a flexible material, such as cardboard, plastic, or thin metal. The strip 12 has a substantially flat base 14 and a pair of substantially parallel arms or flanges 16—16, one along each side of the base 14, which are substantially perpendicular to the base and extend therefrom in the same direction. Each flange 16 has a plurality of longitudinally spaced, substantially parallel slits 18 extending from the free edge thereof to a point short of the base 14. The slits in one flange are in alignment with the slits in the other flange to provide a plurality of opposed pairs of slits along the strip 12. A plurality of small holes 20 are provided through each of the flanges 16 with each hole 20 being located on a slit 18 and preferably at the bottom end of the slit. The free edge of each of the flanges 16 is serrated to provide a plurality of substantially V-shaped notches 22 which are located so that a slit 18 starts at the bottom of each notch 22. Base 14 has a plurality of longitudinally spaced aligned holes 24 which are shown to be positioned such that each hole 24 is in transverse alignment with a pair of opposed slits 18. The electrical components 26 are mounted on the strip 12 in substantially parallel aligned relation. The electrical components 26, which may be resistors, capacitors, rectifiers, or the like, are of the type having a body portion 25 with a pair of aligned lead wires 27 extending from opposite ends thereof. Although the body portions 25 of the components 26 are shown to be cylindrical, they may be rectangular or any other such shape. The components 26 are mounted on the strip 12 with the body portions 25 positioned between the side flanges 16, which are spaced apart a distance slightly greater than the length of the body portions 25, and with the lead wires 27 extending through the holes 20 and projecting beyond the flanges 16. For reasons which will be explained later the body portion 25 of each component 26 is shown to extend over a hole 24 in the base 14 (FIGURE 2). However, holes 24 may be positioned between the components 26 if so desired.

Strip 12 is formed from a continuous length flat blank 28 (FIGURE 3) having the notches 22, slits 18, and holes 20 provided along each side thereof as well as holes 24 between the side edges. Blank 28 is also provided with a pair of longitudinally extending, substantially parallel fold lines. Each fold line is formed by a plurality of short longitudinally spaced slits or indentations 30. The package 10 is formed by bending each side edge of the blank 28 along the fold lines to form the side flanges 16. The components 26 are individually placed on the strip 12 with the body portion 25 positioned between the flanges 16 and the lead wires 27 resting in opposed notches 22. The notches 22 guide the lead wires 27 to the slits 18. By applying pressure on the body portion 25 the lead wires 27 are forced through the slits 18 into the holes 20. The slits 18 then close up to mechanically lock and hold the component 26 on the strip 12. When a desired number of the components 26 have been mounted on the strip 12, the strip is then cut to provide the package. For automatic assembly of the components 26, the strip 12 can be fed under an insertion apparatus by an indexing mechanism, such as a sprocket wheel engaging in the holes 24 in the base portion 14. By having a hole 24 beneath every component 26 the holes can also be used for counting the components and, if desired, numbering indices can be provided on the back of the base portion 14 beside the holes 24. With the holes 24 directly beneath the components they also serve a purpose in the testing of the components after they have been packaged. For this purpose the package 10 is passed through an apparatus which tests each component 26. If a component is not of the desired value, an ejector pin can be passed through the hole 24 beneath the component to engage it and force the component from the strip 12. In the same manner components of a particular value can be picked out of a package 10.

The package 10 lends itself to easy shipment and use by the users of the components 26. Since the components 26 are mechanically gripped and held on the strip 12, the package 10 can be handled with little possibility of any of the components becoming loose even to the point of turning the package completely over. For sale to the small user of electrical components, short lengths of the component carrying strip containing small quantities of the components can be placed in envelopes. By leaving one or two of the pairs of slits 18 at one end of the strip 12 empty, a hole 24 in the base portion 14 will be exposed. This permits the user to hang the packages 10 on a hook or rack with the components 26 facing outwardly so that the components are easily identifiable and accessible for removal from the strip 12 when required. Furthermore, two or more of the short strip packages 10 may be connected together by a rivet extending through the exposed holes 24 and the group of packages similarly sold in envelopes. For larger users of the short strip packages, the packages 10 may be arranged for sale in rectangular boxes or cartons as shown in FIGURES 4 and 5. For this arrangement a package 10*a* is placed in the bottom of the box 32 along one side of the box. A second package 10*b* is placed in the box 32 with its strip 12*b* positioned along one side of the strip 12*a* of the first package 10*a* and resting on the leads 27*a* extending from said side of the first package. The component leads 27*b* extending from the side of strip 12*b* adjacent to the strip 12*a* of the first package 10*a* extend over strip 12*a* and through the aligned notches 22*a* in the flanges 16*a* thereof to align the components in the two packages. A third package (not shown) can be placed in box 32 over the first package 10*a* and additional packages can be similarly stacked in the alternating side-by-side relation until the box is filled. This arrangement of the packages 10 in the box 32 permits a large number of the packages 10 to be stacked in a minimum amount of space.

Figure 7:
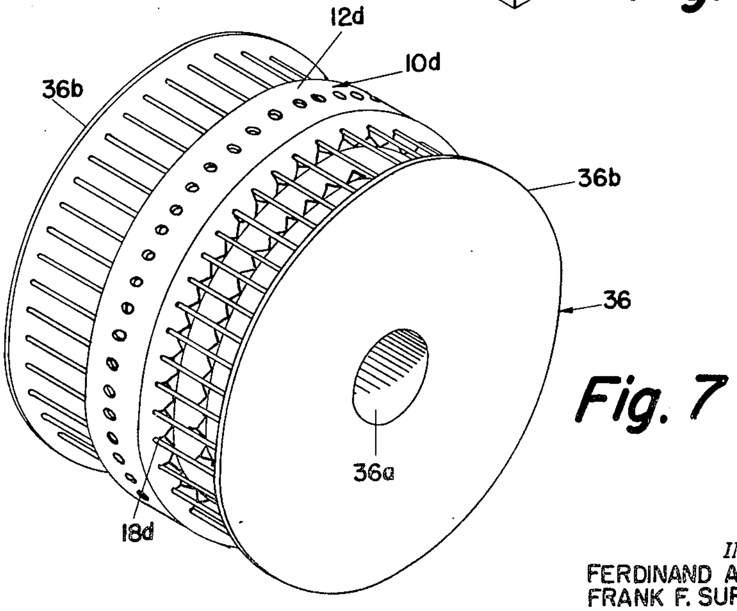
FIGURE 7 is a perspective view of still another arrangement of the package for shipment.

For the large user of components and particularly for use in automatic assembly apparatus the package 10 is provided in long continuous lengths of the strip 12 containing a large quantity of components 26. FIGURE 6 shows one method of arranging such a long package 10*c* in a container 34 for shipping. In this arrangement one end portion of the package 10*c* is laid flat in the rectangular container 34 and the rest of the package 10*c* is folded back and forth in zig-zag fashion with each portion stacked in the container 34 upon the previous portions. Another method of arranging a long length package for shipping is shown in FIGURE 7. For this arrangement the container 36 is in the form of a reel comprising a cylindrical core 36*a* having annular flange 36*b* at each end thereof. The flanges 36*b* are spaced apart a distance slightly greater than the length of the components. A long length package 10*d* is spirally wound on the core 36*a* with the inside of the U-shaped strip 12*d* facing toward the core 36*a*. By winding the package 10*d* on the core 36*a* in this manner the sides of the slits 18*d* are forced more tightly together to provide for additional locking of the components in the package.

Figures 8, 9:
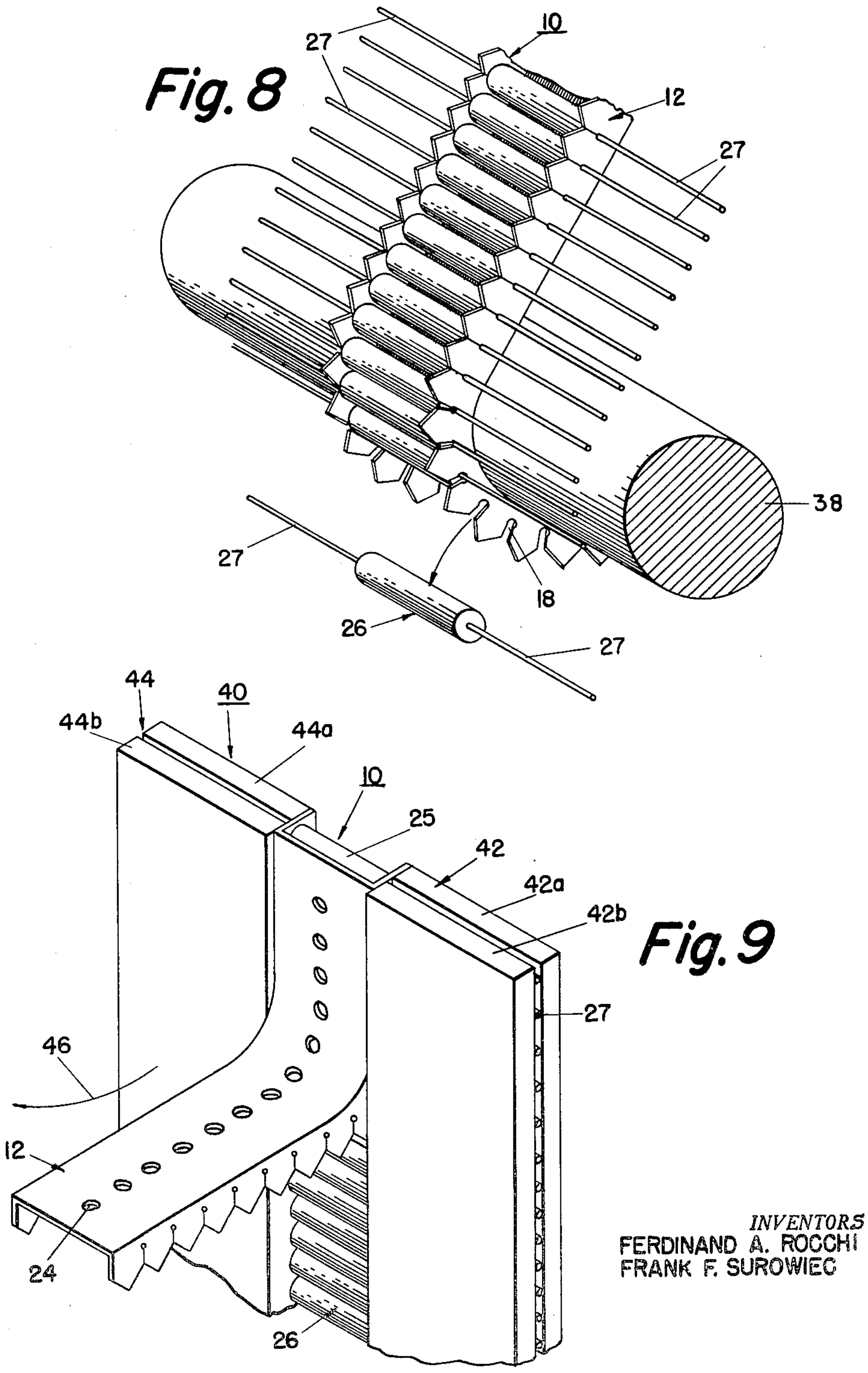
FIGURE 8 is a perspective view of one method of releasing the components from the package.
FIGURE 9 is a perspective view of another method of releasing the components into a feeding magazine of an automatic assembly apparatus.

Although the components 26 are mechanically held in the package, they can be easily removed from the strip 12 both individually, by merely pulling the component 26 by the body portion 25, and in a continuous manner for feeding into automatic assembly apparatus. Referring to FIGURE 8, one method of continuously releasing the components 26 from the strip 12 comprises placing the strip 12 with the bottom of the base 14 on a roller 38 or any other object having a sharp edge and pulling the strip 12 around the sharp edge. As shown in FIGURE 8, this causes the slits 18 to open up and the components will drop out. A feed hopper for an automatic assembly apparatus can be placed under the roller 38 and the components 26 will be automatically fed into the hopper. The strip 12 can be automatically pulled around the roller 38 by a sprocket wheel or other indexing mechanism engaging the holes 24 in the base 14 of the strip. FIGURE 9 shows another method of automatically releasing the components 26 into another type of feed hopper 40 commonly used on automatic assembly apparatus. Hopper 40 comprises two pairs of vertically extending arms 42 and 44. Arms 42*a* and 42*b* of pair 42 are parallel with each other and spaced apart a distance substantially equal to the diameter of the lead wires 27. Arms 44*a* and 44*b* of pair 44 are similarly positioned. Arms 42*a* and 42*b* are in alignment with arms 44*a* and 44*b*, respectively, and spaced therefrom a distance at least equal to the width of strip 12. Package 10 is fed vertically into hopper 40 with the strip 12 fitting between the pairs of arms 42 and 44 and the component leads fitting between the arms 42*a*, 42*b*, 44*a* and 44*b* of each pair. The leading end of strip 12 is then pulled away from the hopper 40 in the direction of arrow 46. This opens up the slits 18 and leaves the components 26 free in the hopper 40 to drop into the assembly apparatus. The package 10 may be continuously fed into hopper 40 by an indexing mechanism engaging in holes 24.

Thus there is provided a package for electrical components which mechanically holds the components in an oriented manner to allow for ease of handling without the components becoming loose but still allow for ease of releasing the components either individually or continuously. Furthermore, the package is inexpensive, simple in construction and easy to assemble and can contain any desired quantity of the components so that the same package can be used to supply both small and large users of the components. In addition, the package can be used as a holder for the components for manual assembling of the components into electrical equipment or for performing certain operations on the components. It is often necessary to shorten or bend the leads of the components so that the components will fit into a desired assembly. Since the package mechanically holds the components, the package can be fed through a lead cutting or bending apparatus and the components will come out still held in an oriented manner for further handling. There are many types of electrical equipment in which the electrical components, particularly resistors, are connected to an aligned row of terminal points. Previously this was accomplished by individually holding the components with their leads contacting the terminal point and soldering the lead thereto. However, with the components arranged in the package of this invention the package can be held in one hand with the leads of all the components simultaneously contacting the various terminal points and in one operation all the leads can be quickly soldered to the contact points. Thus, the package of this invention permits a much faster and easier assembly of the components. Furthermore, since the package is flexible, it is not necessary that the terminal points be in a straight line since the holding strip can be bent to follow any arcuate path of the terminal points.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. A holder for electrical components of the type having a body portion with a wire lead extending from each end thereof comprising the combination of an elongated substantially U-shaped channel-like strip of flexible material, a plurality of longitudinally spaced slits in each side arm of the channel extending from the edge of the arms, the slits in one side arm being in alignment with those in the other side arm, the arms being spaced apart a distance sufficient to receive therebetween the body portions of the electrical components with the leads of the components extending through the slits, and a plurality of longitudinally spaced aligned holes in the base of said strip between the arms of said strip, the number of said holes in the base of said strip per unit length of the strip being equal to the number of slits in each side arm per unit length of said strip with the spacing between the centers of adjacent holes being equal to the spacing between said slits.

2. A package of electrical components of the type having a body portion with a wire lead extending from each end thereof, comprising the combination of a relatively narrow elongated strip of flexible material having a pair of side flanges extending substantially perpendicular thereto in the same direction, a plurality of longitudinally spaced slits in each flange extending from the free edge thereof, the slits in one flange being in alignment with the slits in the other flange, a plurality of longitudinally spaced aligned holes in said strip between said flanges, the number of said holes in said strip per unit length of the strip being equal to the number of slits in each flange per unit length of said strip with the spacing between the centers of adjacent holes being equal to the spacing between said slits and a plurality of the electrical components supported in substantially parallel relation on said strip with the body portion thereof being between said flanges and the leads extending through the slits, said slits mechanically holding the components to the strip by the leads.

3. The combination as set forth in claim 2 in which there is a hole of substantially the same diameter as the leads through the flanges at the bottom of each slit and the leads extend through said holes.

4. The combination as set forth in claim 3 in which there is a V-shaped notch in the edge of the flanges at the top of each slit to guide the leads into the slits.

5. A package of electrical components of the type having a body portion with a wire lead extending from each end thereof comprising the combination of a reel composed of a cylindrical core having a substantially annular flange at each end thereof an elongated, substantially U-shaped, channel-like holder strip of flexible material, a plurality of longitudinally spaced slits in each side arm of the strip extending from the edge of the arms, the slits in one arm being in alignment with the slits in the other arm, a plurality of said electrical components mounted in substantially parallel relation on said strip with the body portions of the components being between the side arms of the strip and the leads extending through and mechanically held by the slits, said component containing holder strip being spirally wound on the core of said spool with the inside of the channel strip facing inwardly toward the core.

6. The combination as set forth in claim 5 in which the flanges of said reel are spaced apart a distance substantially equal to the length of the electrical components so that the convolutions of the component containing strip on the reel are arranged in radial alignment.

7. A package of electrical components of the type having a body portion with a wire lead extending from each end thereof comprising the combination of a substantially rectangular box, and a pair of electrical component carrying strips in the box, each strip comprising an elongated, substantially U-shaped, channel-like strip of flexible material, a plurality of longitudinally spaced slits in each side arm of said strip extending from the edge of said arms with the slits in one arm being in alignment with the slits in the other arm, and a plurality of said components mounted in substantially parallel relation on said strip with the body portions of the components being between the side arms and the leads extending through and mechanically held by the slits, one of said components containing strips resting on the bottom of said box and the other of said strips resting on the leads of the components in the one strip and in substantially side-by-side parallel relation to said one strip.

8. The combination as set forth in claim 7 in which the side arms of the strips have V-shaped notches along their edges, one at the top of each slit, and the leads of the components in said other strip which project over the one strip extending through the notches in the one strip.

9. The combination as set forth in claim 7 including additional component carrying strips stacked in the box in similarly alternating side-by-side relation.

10. A package of electrical components of the type having a body portion with a wire lead extending from each end thereof comprising the combination of a substantially rectangular box, an electrical component carrying strip of a length longer than said box arranged therein, said strip comprising an elongated, substantially U-shaped channel-like strip of flexible material, a plurality of longitudinally spaced slits in each side arm of said strip extending from the edge of said arms with the slits in one arm being in alignment with the slits in the other arm, and a plurality of said components mounted in substantially parallel relation on said strip with the body portions of said components being between the side arms and the leads extending through and mechanically held by the slits, the component carrying strip having a portion hereof resting on the bottom of said box and the rest of said strip being folded upon said first portion to be arranged in said box in stacked zig-zag relation.

11. A package of electrical components of the type having a body portion with a wire lead extending from each end thereof comprising the combination of a relatively narrow elongated strip of flexible material having a pair of side flanges extending substantially perpendicularly thereto in the same direction, a plurality of longitudinally spaced slits in each flange extending from the free edge thereof, the slits in one flange being in alignment with the slits in the other flange, a plurality of longitudinally spaced aligned holes in said strip between said flanges, each of said holes being in transverse alignment with a separate pair of opposed slits, and a plurality of the electrical components supported in substantially parallel relation on said strip with the body portion thereof being between said flanges and the leads extending through the slits, said slits mechanically holding the components to the strip by the leads.

References Cited in the file of this patent

UNITED STATES PATENTS

| | | |
|---|---|---|
| 2,135,134 | Ehlers | Nov. 1, 1938 |
| 2,191,573 | Manfredi | Feb. 27, 1940 |
| 2,282,476 | Buttery | Jan. 15, 1952 |
| 2,794,549 | Feibusch | June 4, 1957 |
| 2,839,188 | Cipriani | June 17, 1958 |